United States Patent
Kanou

(10) Patent No.: US 7,408,765 B2
(45) Date of Patent: Aug. 5, 2008

(54) ELECTRIC CONNECTION BOX

(75) Inventor: Tomoki Kanou, Yokkaichi (JP)

(73) Assignees: Autonetworks Technologies, Ltd., Mie (JP); Sumitomo Wiring Systems, Ltd., Mie (JP); Sumitomo Electric Indusries, Ltd., Osaka (JP)

( * ) Notice: Subject to any disclaimer, the term of this patent is extended or adjusted under 35 U.S.C. 154(b) by 61 days.

(21) Appl. No.: 11/472,348

(22) Filed: Jun. 22, 2006

(65) Prior Publication Data

US 2006/0292904 A1 Dec. 28, 2006

(30) Foreign Application Priority Data

Jun. 23, 2005 (JP) ............................. 2005-183422
Jun. 23, 2005 (JP) ............................. 2005-183424

(51) Int. Cl.
 H02B 1/26 (2006.01)
 H01R 12/00 (2006.01)
(52) U.S. Cl. ..................... 361/622; 361/624; 361/641; 439/76.2
(58) Field of Classification Search ................. None
 See application file for complete search history.

(56) References Cited

U.S. PATENT DOCUMENTS

| | | | | |
|---|---|---|---|---|
| 5,822,189 A * | 10/1998 | Isshiki | ........................ | 361/736 |
| 6,116,916 A * | 9/2000 | Kasai | ........................ | 439/76.2 |
| 6,265,659 B1 * | 7/2001 | Kaiser | ........................ | 174/564 |
| 6,430,054 B1 * | 8/2002 | Iwata | ........................ | 361/752 |
| 6,522,528 B2 * | 2/2003 | Yamane | ....................... | 361/601 |
| 6,605,780 B2 * | 8/2003 | Chiriku et al. | ................ | 174/60 |
| 6,671,173 B2 * | 12/2003 | Ashiya et al. | ............... | 361/704 |
| 6,724,627 B2 * | 4/2004 | Onizuka et al. | .............. | 361/704 |
| 6,785,139 B2 * | 8/2004 | Onizuka et al. | .............. | 361/704 |
| 6,924,985 B2 * | 8/2005 | Kawakita et al. | ............ | 361/715 |
| 7,074,053 B2 * | 7/2006 | Kawakita et al. | ........... | 439/76.1 |
| 7,099,155 B2 * | 8/2006 | Kobayashi et al. | .......... | 361/719 |
| 7,154,753 B2 * | 12/2006 | Kobayashi | ................... | 361/715 |
| 7,189,082 B2 * | 3/2007 | Fukushima et al. | ......... | 439/76.2 |
| 7,233,495 B2 * | 6/2007 | Tomikawa et al. | ........... | 361/719 |
| 7,283,366 B2 * | 10/2007 | Yamashita | ................... | 361/719 |
| 2004/0001319 A1 | 1/2004 | Kawakita et al. | | |
| 2004/0004816 A1 * | 1/2004 | Yamaguchi et al. | .......... | 361/695 |

FOREIGN PATENT DOCUMENTS

JP A-2004-040873 2/2004

* cited by examiner

*Primary Examiner*—Boris L Chervinsky
(74) *Attorney, Agent, or Firm*—Oliff & Berridge, PLC

(57) ABSTRACT

An electric connection box provided with a circuit structure, a casing for accommodating the circuit structure therein, a plurality of bus bar terminals disposed on a cabling path crossing the casing in a horizontal direction and electrically connecting the circuit structure and an external connecter to each other, and a terminal support portion for supporting a horizontal portion crossing the casing in the horizontal direction in the plurality of bus bar terminals from below, in which a first rib capable of contact with the horizontal portion from below are projected on a surface opposite to the horizontal portion in the terminal support portion, and a space between the first rib is a first groove portion recessed downward.

20 Claims, 9 Drawing Sheets

ELECTRIC CONNECTION BOX

BACKGROUND OF THE INVENTION

1. Field of the Invention

The present invention relates to an electric connection box.

2. Description of the Related Art

An electric connection box mounted on an automobile or the like, as described in Japanese Patent Laid-Open No. 2004-40873, is known. This electric connection box is provided with a circuit board to which a bus bar is bonded and a case for accommodating this circuit board. A plurality of fuse connection terminals and signal terminals are formed on the bus bar. The fuse connection terminals are extended from an upper end of the circuit board and disposed along an upper end face of an intermediate case with their tip ends formed to project upward. On the other hand, the signal terminals are extended from a lower end of the circuit board and disposed along a bottom surface in the intermediate case with their tip ends formed to project downward.

In the above structure, if water caused by rain, washing, etc., enters the case, the water might contact the upper or bottom surface of the intermediate case, which could result in a short circuit within the plurality of terminals. Particularly, these terminals are often positioned very close to each other due to limitations of space, and in such a case, the above short circuit problem becomes noticeable.

SUMMARY OF THE INVENTION

An object of the present invention, the present invention being applicable to an electric connection box to be mounted on an automobile or the like, is to prevent bus bar terminals disposed in a case of the electric connection box from being short-circuited due to the leakage of water into the box.

A first aspect of the invention is an electric connection box provided with a circuit structure, a casing for accommodating the circuit structure therein, a plurality of bus bar terminals disposed on a cabling path, the terminals crossing the casing in the horizontal direction and electrically connecting the circuit structure and an external connecter to each other, and a terminal support portion for supporting a horizontal portion crossing the casing in the horizontal direction in the plurality of bus bar terminals from below, in which first ribs capable of contact with the horizontal portions from below are projected on a surface opposite to the horizontal portions in the terminal support portion, and a space between the first ribs is a first groove portion recessed downward.

According to the first aspect of the invention, a distance between the adjacent bus bar terminals can be increased by a portion of the recess of the first groove portion. Therefore, moisture adhering to the horizontal portion of the bus bar terminal that would otherwise reach the horizontal portion of other adjacent bus bar terminals is stopped or significantly reduced, and short circuit between the bus bar terminals can be prevented.

A second aspect of the invention is an electric connection box in which the width of a contact surface in the first rib brought into contact with the horizontal portion is smaller than the width of the horizontal portion of the bus bar terminal.

According to the second aspect of the invention, an angular portion is not formed by the contact surface of the first rib and a side face of the horizontal portion of the bus bar terminal. Therefore, moisture can be prevented from accumulating in this angular portion. Thereby, short-circuit between the bus bar terminals can be prevented.

A third aspect of the invention is an electric connection box in which an inclined portion descending along the length direction of the first groove portion is provided on a bottom face of the first groove portion.

According to the third aspect of the invention, the moisture reaching each of the first groove portions flows down while being guided by the inclined portion provided on the bottom face and is easily discharged from the terminal support portion. Therefore, a situation where moisture stays accumulated in the terminal support portion can be prevented. Thereby, short-circuit between the bus bar terminals can be prevented more surely.

A fourth aspect of the invention is an electric connection box in which a displacement restriction portion for restricting displacement caused by inclination of the horizontal portion due to pressing on the horizontal portion from above is provided in the casing, second ribs capable of contact with the horizontal portion from above are projected on a surface opposite to the horizontal portions in the displacement restriction portion, and a space between the second ribs is a second groove portion recessed upward.

According to the fourth aspect of the invention, the moisture adhering to the horizontal portion of the bus bar terminal can escape upward by the depth of the second groove portion. Thereby, since horizontal spreading of the moisture adhering to the horizontal portion can be suppressed, short-circuit between the adjacent bus bar terminals can be prevented.

A fifth aspect of the invention is an electric connection box in which a narrow portion with a width smaller than the other areas is provided in the horizontal portion.

According to the fifth aspect of the invention, since the narrow portion is provided in the horizontal portion of the bus bar terminal, it is possible to increase a distance between the horizontal portions of the adjacent bus bar terminals. In this case, the moisture adhering to the horizontal portion that would otherwise reach the adjacent other horizontal portions is stopped or significantly reduced, and thus a short-circuit between the bus bar terminals can be avoided.

It is also possible to narrow the entire width of the bus bar terminal in order to take the distance between the horizontal portions as large as possible. However, since a relatively large electric current flows through the circuit structure, a relatively large electric current also flows through the bus bar terminal connected to the circuit structure accordingly. Therefore, if the entire width of the bus bar terminal is narrowed, there is a fear that a required current amount can not be ensured. Moreover, if the bus bar terminal is narrowed over the entire width, it is possible that excessive deformation or breakage can occur at connection to an external connector or the like. Thus, in this fifth aspect of the invention, the narrow portion is provided only at the horizontal portion. Thereby, short-circuit between the bus bar terminals can be prevented while securing rigidity or electric power of the bus bar terminals.

A sixth aspect of the invention is an electric connection box in which the plurality of bus bar terminals extend in a direction crossing the horizontal portion from the end opposite to the side connected to the circuit structure in the horizontal portion and a connection portion connectable to the external connector is provided at this extended portion.

According to the sixth aspect of the invention, though a pressing force or pulling force is applied to the connection portion of the bus bar terminal at detachment (or the like) of the external connector, the narrow portion is provided at the horizontal portion of the bus bar terminal and the bus bar terminal is easily deflected at this narrow portion. Therefore, even if the pressing force or pulling force is applied to the bus bar terminal, this pressing force or pulling force can be absorbed. Thereby, breakage (or bending) of the bus bar terminal at the connection portion between the bus bar terminal and the circuit structure can be prevented.

A seventh aspect of the invention is an electric connection box in which the narrow portion is provided with both ends left in the cabling direction of the horizontal portion.

According to the seventh aspect of the invention, since the both ends at the horizontal portion of the bus bar terminal maintain the width dimension of the original bus bar terminal, the horizontal portion of the bus bar terminal has sufficient strength. Therefore, even if the narrow portion is provided at the bus bar terminal, breakage of the bus bar terminal at the connection portion between the bus bar terminal and the circuit structure can be prevented.

An eighth aspect of the invention is an electric connection box in which a taper portion whose width is gradually narrowed toward the narrow portion from the both ends is provided between the narrow portion and the both ends.

According to the eighth aspect of the invention, when the bus bar terminal is deflected, excessive concentration of stress to the border between the both ends and the narrow portion in the horizontal portion of the bus bar terminal can be avoided. Thereby, breakage of the bus bar terminal can be prevented.

DETAILED DESCRIPTION OF THE PREFERRED EMBODIMENTS

A first embodiment of the present invention will be described below referring to FIGS. 1 to 5.

Figure 1:
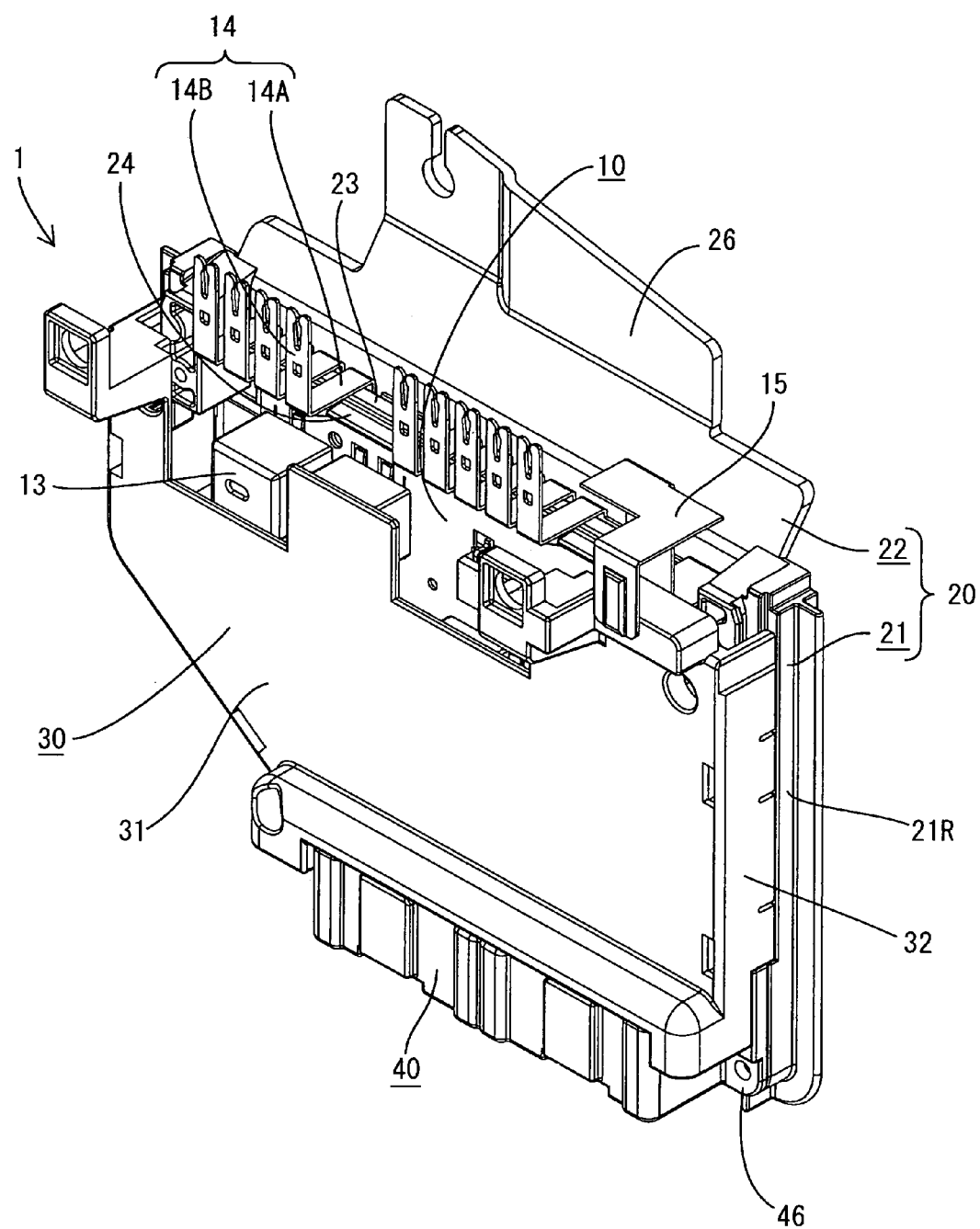
FIG. 1 is a perspective view of an appearance of an electric connection box according to a first embodiment.
Figure 2:
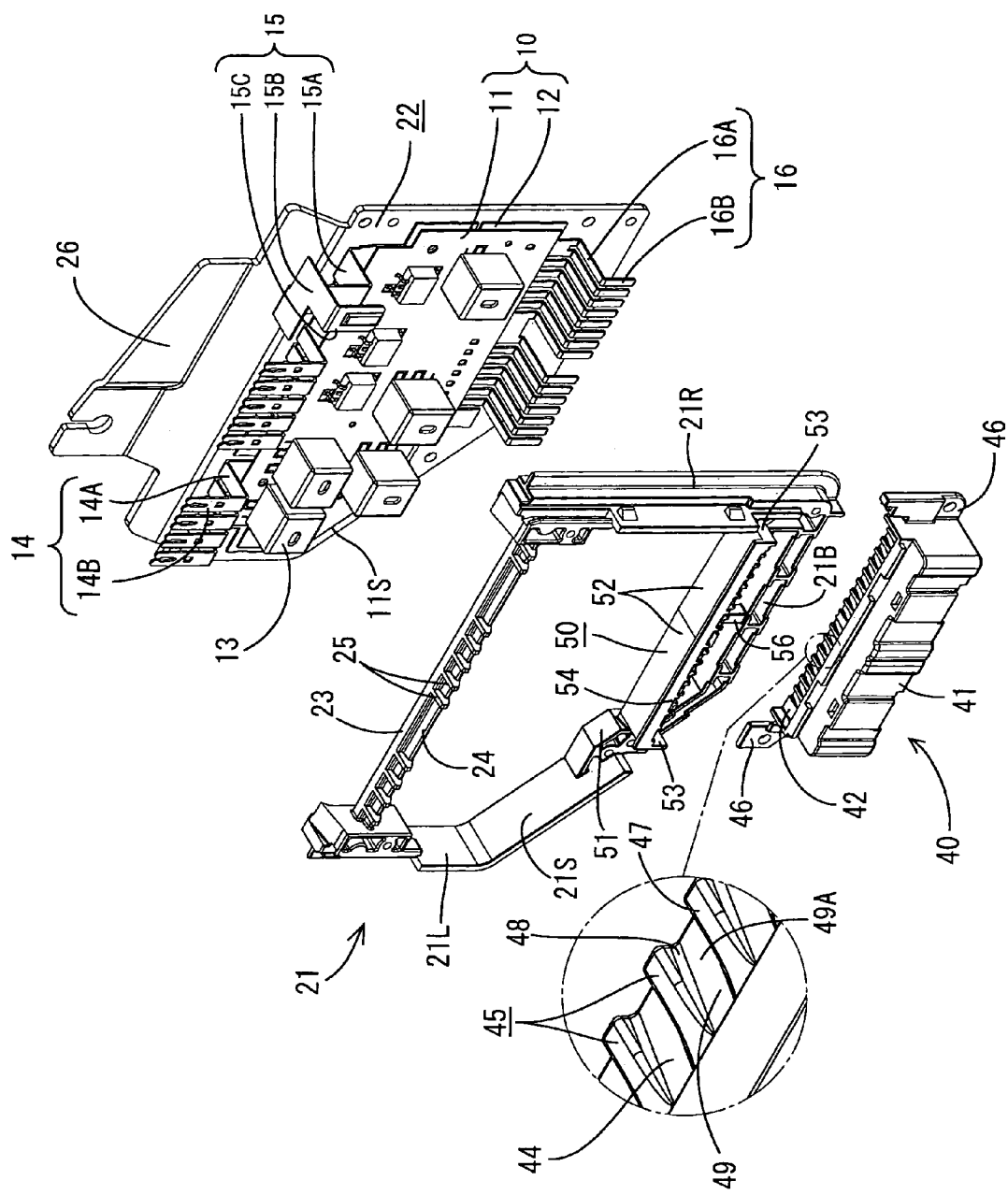
FIG. 2 is a perspective view showing a state before a frame body and a lower connector are assembled to a circuit structure in the electric connection box according to the first embodiment.

FIG. 1 is a perspective view of an appearance of an electric connection box 1 according to this embodiment. FIG. 2 is a perspective view showing a state before a frame body 21 and a lower connector 40 are assembled to a circuit structure 10.

Descriptions of each member of the electric connection box 1 will be described below with the front left side (cover 30 side) referred to as a front side, for the rear right side (case 20 side) as a back side, for the upper side as above, for the lower side as below, for the right side as right and for the left side as left in FIG. 1.

The electric connection box 1 includes circuit structure 10 provided with a circuit board 11 and a bus bar 12 accommodated vertically within a case 20 comprising the frame body 21 and a radiator plate 22, the front side of the case 20 being covered by the cover 30 as shown in FIGS. 1 and 2.

The circuit board 11 including circuit structure 10 in a an area substantially in the left half of its lower edge is made as an inclined edge portion 11S inclined toward the upper edge. On the front of this circuit board 11 is formed a conductor pattern (not shown) including a control circuit. Moreover, on the front of this circuit board 11, a switching member 13 such as a relay is implemented.

On the back face of the circuit board 11, the bus bar 12 is bonded. The bus bar 12 is formed by stamping out a metal plate so as to form a predetermined conductive path to be a power circuit. Bus bar 12 is formed in an outer shape substantially in conformity with the circuit board 11, and a plurality of bus bar terminals 14, 15, 16 to be terminals for connection to an external circuit are disposed on its upper and lower edges.

Among the bus bar terminals 14, 15 disposed on the upper side, the upper bus bar terminals 14 (other than the single right-end bus bar terminal 15 disposed on the right end) rise on the front side forming a substantially right angle with the circuit board 11. That is, the upper bus bar terminal 14 comprises a horizontal portion 14A extending in the horizontal direction from the circuit board 11 and a connection portion 14B extending upward from the extended end of horizontal portion 14A substantially in parallel with the circuit board 11. Note that a slit for fuse insertion is formed at the tip end of this connection portion 14B. The right-end bus bar terminal 15 comprises a horizontal portion 15A extending in the horizontal direction from the circuit board 11, a relay portion 15B extending upward from the extended end of this horizontal portion 15A substantially in parallel with the circuit board 11 and bending to the right and then to the front, and a connection portion 15C protruding downward from the edge on the front side of the relay portion 15B.

The plurality of lower bus bar terminals 16 arranged side by side in the right-and-left direction in an area to the right of the inclined edge portion 11S in the lower edge of the circuit board 11, that is, in an area substantially in parallel with the upper edge, comprises a horizontal portion 16A extending in the horizontal direction from the circuit board 11 and a connection portion 16B extending downward from the extended end of this horizontal portion 16A (end opposite to the side bonded to the circuit structure 10) substantially in parallel with the circuit board 11 (direction crossing the horizontal portion 16A). Note that the plurality of upper bus bar terminals 14 and lower bus bar terminals 16 are positioned as close as possible due to limitations of a space.

Figure 3:
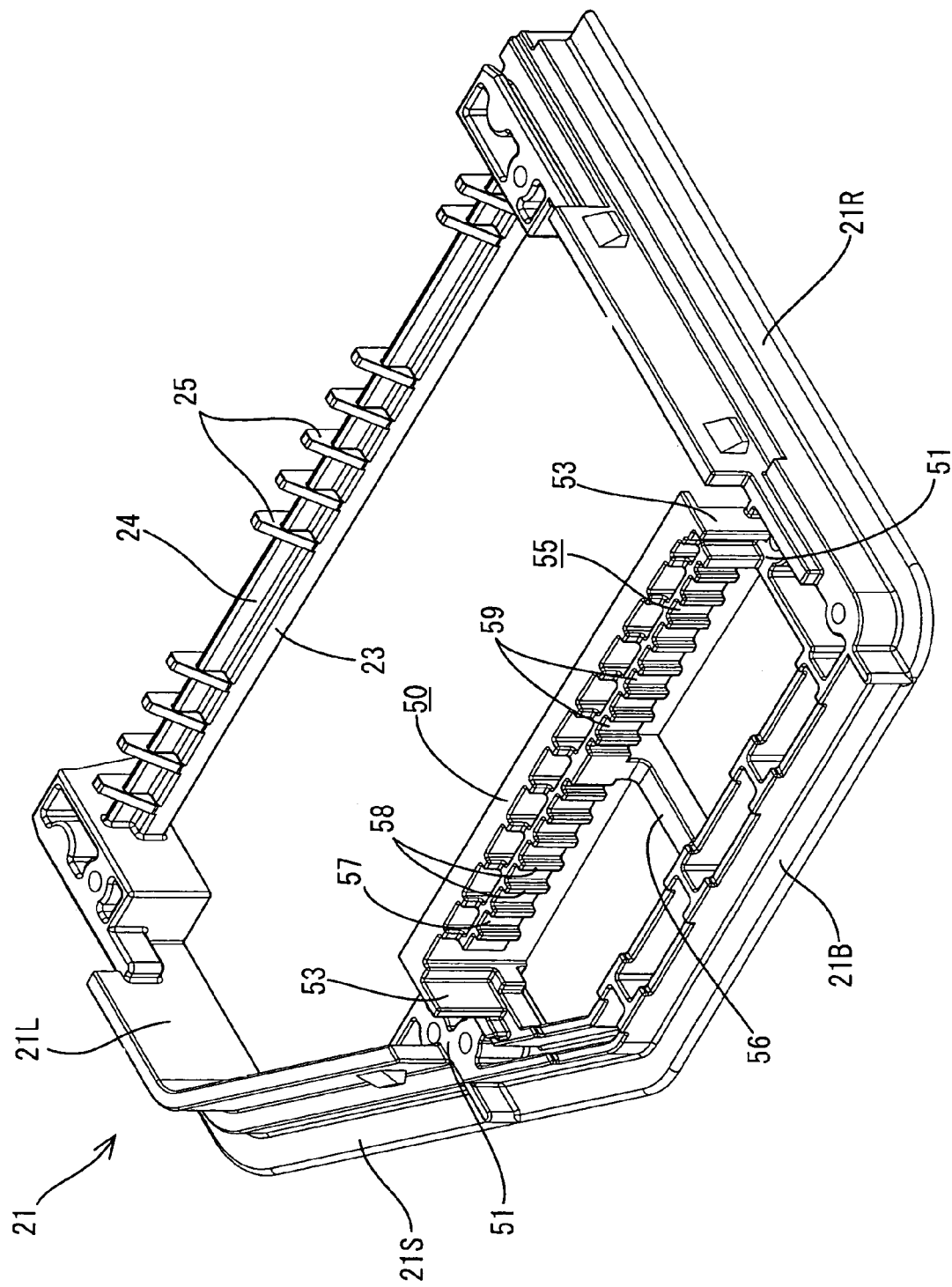
FIG. 3 is a perspective view of the frame body.

FIG. 3 is a perspective view of the frame body 21. As mentioned above, the case 20 accommodating the circuit structure 10 comprises the frame body 21 and the radiator plate 22 (See FIGS. 1 and 4).

As shown in FIG. 3, the frame body 21 is formed by an insulating material such as a synthetic resin. The frame body 21 is formed substantially U-shaped, or substantially following along the lower edge and both the right and left edges among the peripheral edges of the circuit board 11. Specifically, the frame body 21 comprises an inclined frame portion 21S along the inclined edge portion 11S of the circuit board 11, a lower frame portion 21B along an area in the right of the inclined edge portion 11S in the lower edge of the circuit board 11, a left frame portion 21L along the left edge portion of the circuit board 11 and a right frame portion 21R along the right edge portion of the circuit board 11. At an upper part of the frame body 21, a connection portion 23 is provided for connecting the left frame portion 21L and the right frame portion 21R (See also FIG. 2). This connection portion 23 connects the left frame portion 21L and the right frame portion 21R to each other at a position slightly lower than the upper ends of the left frame portion 21L and the right frame portion 21R. The connection portion 23 is formed substantially in a quadrangular prism state. An upper face of the connection portion 23 is brought into contact with a portion of a lower face of the horizontal portion 14A of the upper bus bar terminal 14 closer to the circuit board 11. The connection portion 23 supports the horizontal portions 14A from the lower face side (See also FIG. 4). Moreover, a flange portion 24 is provided at the front of the connection portion 23 (surface opposite to the circuit board 11 side). This flange portion 24 is provided along the length direction of the connection portion 23 substantially at the center position in the vertical direction on the front of the connection portion 23. The flange portion 24 is provided as being extended toward the front side. Moreover, on the front of this connection portion 23, a plurality of plate-state reinforcing portions 25 are formed with the plate direction substantially crossing the length direction of the connection portion 23. This reinforcing portion 25 is provided on the front of the connection portion 23 at positions corresponding to the respective horizontal portion 14A of the upper bus bar terminal 14. And an upper face of each of the reinforcing portions 25 is made flush with the upper face of the connection portion 23. Note that the plate thickness of the reinforcing portion 25 is smaller than the width of the horizontal portion 14A of the upper bus bar terminal 14.

The radiator plate 22 is attached to the frame body 21. The radiator plate 22 is formed by metal with high heat conductivity in a size slightly larger than the circuit board 11 (See also FIG. 2). The radiator plate 22 is assembled to the frame body 21 so as to block an opening on its back side. The radiator plate 22 is bonded on the back face of the bus bar 12 through an insulating adhesive. Moreover, a mounting piece 26 extending stepwise upward on the back face is formed from the upper edge of this radiator plate 22. The electric connection box 1 is mounted, for example, to a vehicle panel through this mounting piece 26 in a vertical attitude with a lower connector 40, which will be described later, faced downward.

The cover 30 is preferably made of a synthetic resin and attached so that an opening on the front side of the case 20 is covered (See FIG. 1). The cover 30 is formed open on the back side and comprises a lid plate portion 31 substantially in the same shape as that of the circuit board 11 and a side wall portion 32 rising toward the back side along both the right and left edges of the lid plate portion 31. The lid plate portion 31 is formed in a plate shape and substantially covers the front side of the circuit board 11. An upper face and a lower face of the cover 30 are open. In the opening on the upper face side of the cover 30, a fuse box (not shown) is mounted. The connection portion 14B of the upper bus bar terminal 14 is inserted into a fuse box, or the like, from below. Moreover, in the opening on the lower face side of the cover 30, the lower connector 40 is mounted.

Figure 4:
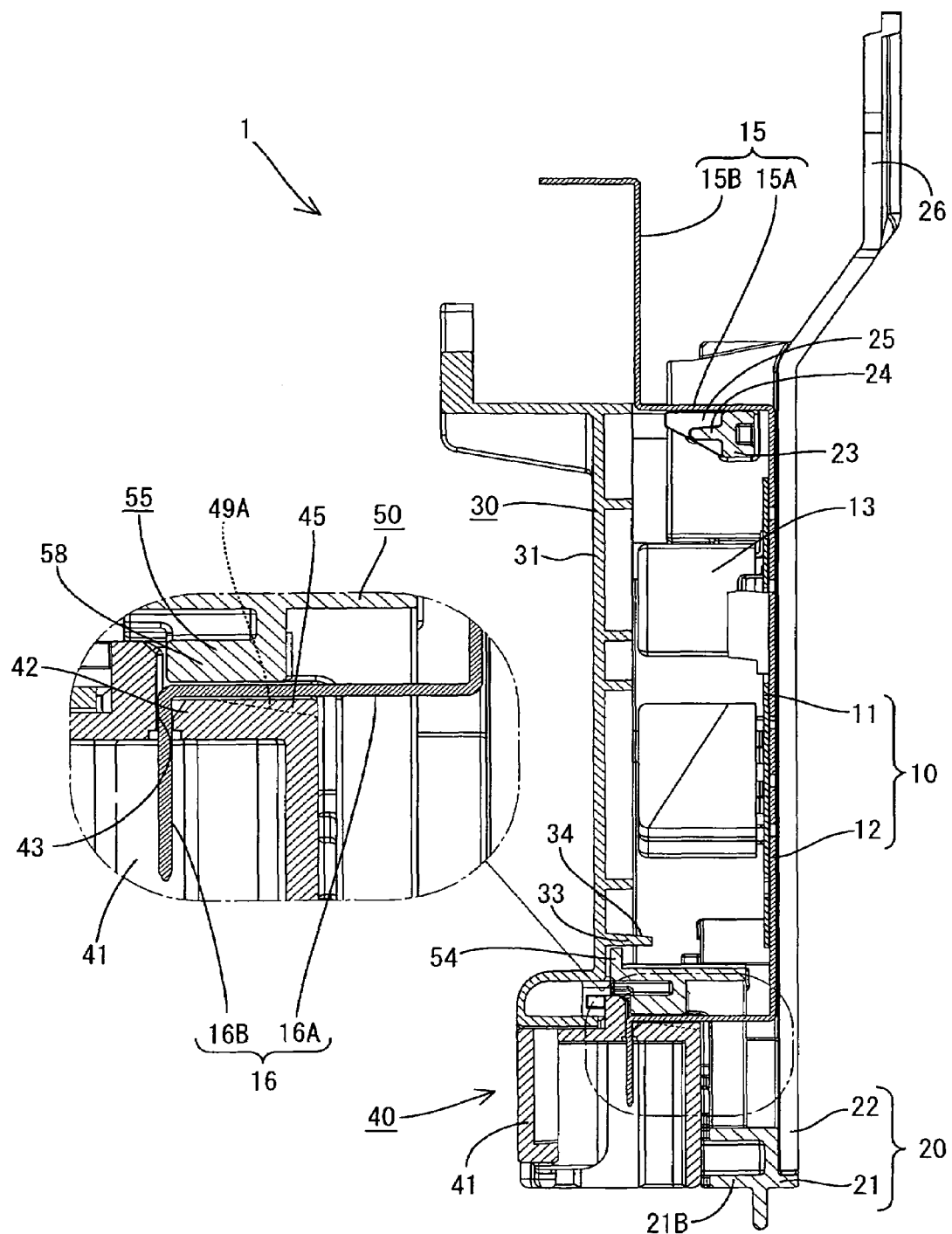
FIG. 4 is a side sectional view of the electric connection box according to the first embodiment.

FIG. 4 is a side sectional view of the electric connection box 1 according to this embodiment.

As shown in FIG. 4, the lower connector 40 is connected to the lower part of the cover 30. The lower connector 40 is provided with a laterally long housing 41, preferably made of an insulative material such as synthetic resin, and open on the lower face side so that the external connector is able to be fitted to this housing 41 from below.

The lower connector 40 is connected to the lower side of the horizontal portion 16A of the lower bus bar terminal 16, and a ceiling portion 42 of the housing 41 supports the horizontal portion 16A from below. That is, the ceiling portion 42 corresponds to the "terminal support portion" of the present invention. An upper face 44 of the ceiling portion 42 is the "opposite face" opposed to the horizontal portion 16A.

On the upper face 44 of the ceiling portion 42, first ribs 45 are provided at positions corresponding to the respective horizontal portions 16A (See FIG. 2). This first rib 45 can be brought into contact with the horizontal portion 16A of the lower bus bar terminal 16 from below.

On the ceiling portion 42 of the housing 41, through holes 43 extending in a vertical direction are provided. Through hole 43 is provided at positions corresponding to the respective connection portions 16B of the lower bus bar terminal 16. The connection portion 16B is accommodated within the housing 41 piercing this through hole 43. The connection portion 16B has its tip end tapered so that it is inserted into the other party terminal (not shown) attached to the external connector. Note that a mounting portion 46 for fixing this lower connector 40 to the frame body 21 is provided on both right and left side faces of the lower connector 40.

As shown in FIGS. 2 to 4, at a position above the lower connector 40, a water resistant wall 50 is provided. This water resistant wall 50 is substantially in parallel with the lower frame portion 21B of the frame body 21 and in a plate-state shape. A joint 51 for connecting the water resistant wall 50 to the frame body 21 is provided on both right and left sides of the water resistant wall 50. Specifically, this joint 51 connects a position closer to the lower end of the right frame portion 21R of the frame body 21 to the right end of the water resistant wall 50. Similarly, the joint 51 connects substantially the center position of the inclined frame portion 21S to the left end of the water resistant wall 50.

The width of the water resistant wall 50 is slightly larger than the area where the horizontal portions 16A of the plural lower bus bar terminals 16 are disposed and the width of the lower connector 40. The end edge of this water resistant wall 50 on the cover 30 side reaches close to the back face of the lid plate portion 31. Also, the end edge of this water resistant wall 50 on the circuit structure 10 side is preferably embedded in a potting material (not shown) covering the front of the circuit board 11.

An upper face of the water resistant wall 50 is a tapered face 52 inclined downward to both right and left ends with substantially the center position in the right-and-left direction as the top of the peak. At both right and left ends of this water resistant wall 50, water resistant side wall portions 53 are provided downward. The lower end of this water resistant side wall portion 53 reaches the ceiling portion 42 of the lower connector 40. This water resistant side wall portion 53 covers the side of the outermost horizontal portion 16A among the horizontal portions 16A of the lower bus bar terminals 16. Also, at the end edge of the water resistant wall 50 on the cover 30 side, a water stop wall 54 is provided upward. This water stop wall 54 protrudes to a position substantially reaching the lower face of a guiding piece 33 provided on the back face of the cover 30. This water stop wall 54 is formed over the entire right-and-left width of the water resistant wall 50.

At a lower part of the water resistant wall 50, a displacement restriction portion 55 is provided integrally (See FIG. 3). This displacement restriction portion 55 restricts upward displacement of the horizontal portions 16A by pressing the horizontal portions 16A from above. That is, the horizontal portions 16A are pushed upward by fitting of the external connecter into the housing 41. However, in this embodiment, since the upper side of the horizontal portions 16A is pressed by the displacement restriction portion 55, upward displacement of the horizontal portions 16A is restricted.

The displacement restriction portion 55 is formed over a range where the horizontal portions 16A are disposed. A bridge portion 56 is provided between a substantially center portion of the displacement restriction portion 55 in the right-and-left direction and the lower frame portion 21B of the frame body 21. On a lower face 57 of the displacement restriction portion 55 (face opposite to the horizontal portions 16A), second ribs 58 are provided at respective positions corresponding to each of the horizontal portions 16A. The lower face of this second rib 58 can be brought into contact with each of the horizontal portions 16A from above. The second rib 58 will be described in detail later together with the first rib 45.

As shown in FIG. 4, the guiding piece 33 is provided on the back face of the cover 30. This guiding piece 33 is provided above the water stop wall 54 and projects from the back face side of the lid plate portion 31 of the cover 30. And this guiding piece 33 reaches the position slightly beyond above the water stop wall 54 in the direction of the back face. The upper face of this guiding piece 33 is a guiding face 34 inclined downward to the projecting end.

Next, the above-mentioned first ribs 45 and the second ribs 58 will be described in detail.

Figure 5:
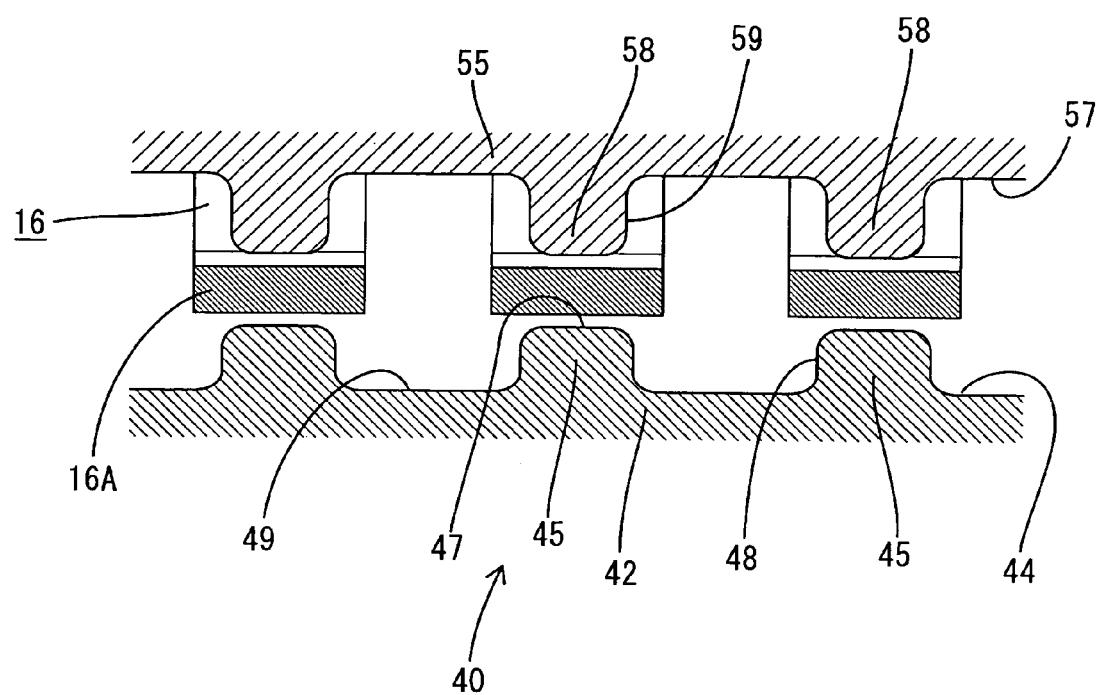
FIG. 5 is a partially enlarged sectional view showing a state where horizontal portions of lower bus bar terminals are held between first ribs and second ribs in the electric connection box according to the first embodiment.

FIG. 5 is a partially enlarged sectional view showing a state where the horizontal portions 16A of the lower bus bar terminals 16 are held between the first ribs 45 and the second ribs 58. In FIG. 5, a state is shown with a gap between the first ribs 45, the second ribs 58 and the horizontal portions 16A to make the drawing easy to understand. However, in a usual case, they are brought into contact with each other (contact state).

The first ribs 45 are provided on the upper face 44 of the housing 41 constituting the lower connector 40. In FIG. 5, the width between the first ribs 45 in the right-and-left direction is smaller than the width between the horizontal portions 16A in the right-and-left direction (the "right-and-left direction" here means the direction where the plurality of first ribs 45 are arranged side by side). Thereby, in each of the first ribs 45, the width of a contact face 47 in contact with the horizontal portion 16A is made smaller than the width of each of the horizontal portions 16A.

Moreover, a space between the first ribs 45 is a first groove portion 48 recessed downward from the contact face 47 by a projecting height of the first rib 45. On a bottom face 49 of this first groove portion 48, an inclined portion 49A inclined along the length direction of each of the first groove portions 48, in other words, the length direction of each of the first ribs 45 (See FIGS. 2 and 4) is provided. This inclined portion 49A descends toward the circuit board 11 side.

On the other hand, the second rib 58 is provided projecting downward from the lower face 57 of the displacement restriction portion 55. The second rib 58 is brought into contact with each of the horizontal portions 16A from above. The second rib 58 is, as shown in FIG. 3, in an elongated shape along the horizontal portion 16A. Also, the width of the second rib 58 in the right-and-left direction is smaller than the width of each of the horizontal portion 16A in the right-and-left direction (the "right-and-left direction" here means the direction where the plurality of second ribs 58 are arranged side by side). Also, a space between the second ribs 58 is a second groove portion 59 recessed upward from the lower face of the second rib 58 by a projecting height of the second rib 58.

If a liquid, for example, water intrudes into the electric connection box 1 due to rain, car wash, etc., the water might reach the upper face 44 of the lower connector 40 and adhere to the periphery of the horizontal portion 16A of the lower bus bar terminal 16. In this case, water adhering to the periphery of the horizontal portion 16A slides along the upper face of the lower connector 40 and flows to the adjacent other horizontal portions 16A. If the first groove portion 48 does not exist between the horizontal portions 16A at this time, the water drop adhering to the periphery of this horizontal portion 16A spreads in the horizontal direction on the upper face 44 of the ceiling portion 42 and there is a good possibility that the water drop reaches the adjacent other horizontal portions 16A. Particularly, if a gap between the lower bus bar terminals 16 is designed as narrow as possible due to limitations of space or the like, a distance between the horizontal portions 16A is not sufficient and even a small amount of moisture adhering to the upper face 44 of the lower connector 40 might cause a short circuit between the adjacent lower bus bar terminals 16.

However, according to the electric connection box 1 of this embodiment, since the first groove portion 48 exists between the first ribs 45, the distance between the adjacent horizontal portions 16A can be longer. Therefore, the water moisture adhering to the periphery of the horizontal portion 16A that otherwise would reach the adjacent other horizontal portions 16A is stopped or significantly reduced, and short circuit between the lower bus bar terminals 16 can be prevented.

Also, if the width of the first rib 45 is formed wider than the horizontal portion 16A, the contact face 47 extends outward in the width direction from the horizontal portion 16A. In this case, an angular portion is formed by the contact face 47 and the side face of the horizontal portion 16A (the face perpendicular to the contact face 47), and moisture can collect in this angular portion. However, in this embodiment, since the width of the contact face 47 of the first rib 45 in the right-and-left direction is formed narrower than the width of the horizontal portion 16A in the right-and-left direction (See FIG. 5), an angular portion is not formed around the horizontal portion 16A and the collection of moisture can be avoided.

Moreover, the water drop having fallen into the first groove portion 48 slides along the inclined portion 49A provided on its bottom face 49, guided by the edge portion of the first groove portion 48 on the circuit board 11 side (i.e. the edge portion on the back side in the upper face 44 of the lower connector 40) and flows down to the back side of the lower connector 40 from there. In this way, since the water drop is easily discharged from the bottom face 49 of the first groove portion 48, the water drop is not accumulated in the first groove portion 48 (the space between the adjacent horizontal portions 16A) and a short circuit between the lower bus bar terminals 16 can be prevented more surely.

Moreover, the second rib 58 is provided on the lower face 57 of the displacement restriction portion 55, and a space between the second ribs 58 is the second groove portion 59 recessed upward, respectively. If the second groove portion 59 is not provided on the lower face 57 of the displacement restriction portion 55 and the lower face 57 is flat, the lower face 57 of the displacement restriction portion 55 and the upper face of the horizontal portion 16A are brought into contact with each other over the whole surface. In this case, water adhering to the horizontal portion 16A is crushed between the lower face 57 of the displacement restriction portion 55 and the bottom face 49 of the first groove portion 48 and is spread through a narrow gap between them in the horizontal direction. However, according to this embodiment, since water adhering around the horizontal portion 16A can escape upward by a portion of depth of the second groove portion 59, spread of water in the horizontal direction can be suppressed. Therefore, spread of the water between the adjacent horizontal portions 16A causing a short circuit between the lower bus bar terminals 16 can be prevented more surely.

As described above, according to this embodiment, on the upper face 44 of the ceiling portion 42 of the lower connector 40, first ribs 45 to be brought into contact with each of the horizontal portions 16A from below are projected at positions corresponding to the respective horizontal portions 16A of the lower bus bar terminals 16. And a space between the first ribs 45 is the first groove portion 48 recessed downward, respectively. Thereby, the distance between the horizontal portions 16A of the adjacent lower bus bar terminals 16 can be made longer by the depth of the first groove portion 48. Therefore, water adhering to the horizontal portion 16A that would otherwise reach the adjacent other horizontal portions 16A is stopped or significantly reduced, thus a short circuit between the lower bus bar terminals 16 can be avoided.

Moreover, on the bottom face 49 of the first groove portion 48, the inclined portion 49A descending along the length direction of each of the first groove portion 48 is provided. Thereby, water sliding to each of the first groove portion 48 is guided by the inclined portion 49A provided on the bottom face 49 to flow down and easily discharged from the ceiling portion 42 of the lower connector 40. Therefore, the situation where water accumulates in the ceiling portion 42 is avoided and short circuit between the lower bus bar terminals 16 can be surely prevented.

Furthermore, on the lower face 57 of the displacement restriction portion 55, the second ribs 58 (brought into contact with each of the horizontal portions 16A from above) are projected. And a space between the second ribs 58 is the second groove portion 59 recessed upward. Thereby, water adhering to the horizontal portion 16A is not crushed in a narrow gap between the lower face 57 of the displacement restriction portion 55 and the bottom face 49 of the first groove portion 48 but can escape upward by the depth of the second groove portion 59, and thus, a spreading of water in the horizontal direction can be suppressed by that amount. Therefore, spread of the moisture between the adjacent horizontal portions 16A causing short circuit between the lower bus bar terminals 16 can be avoided.

A second embodiment of the present invention will be described below referring to FIGS. 6, 7, 8.

Figure 6:
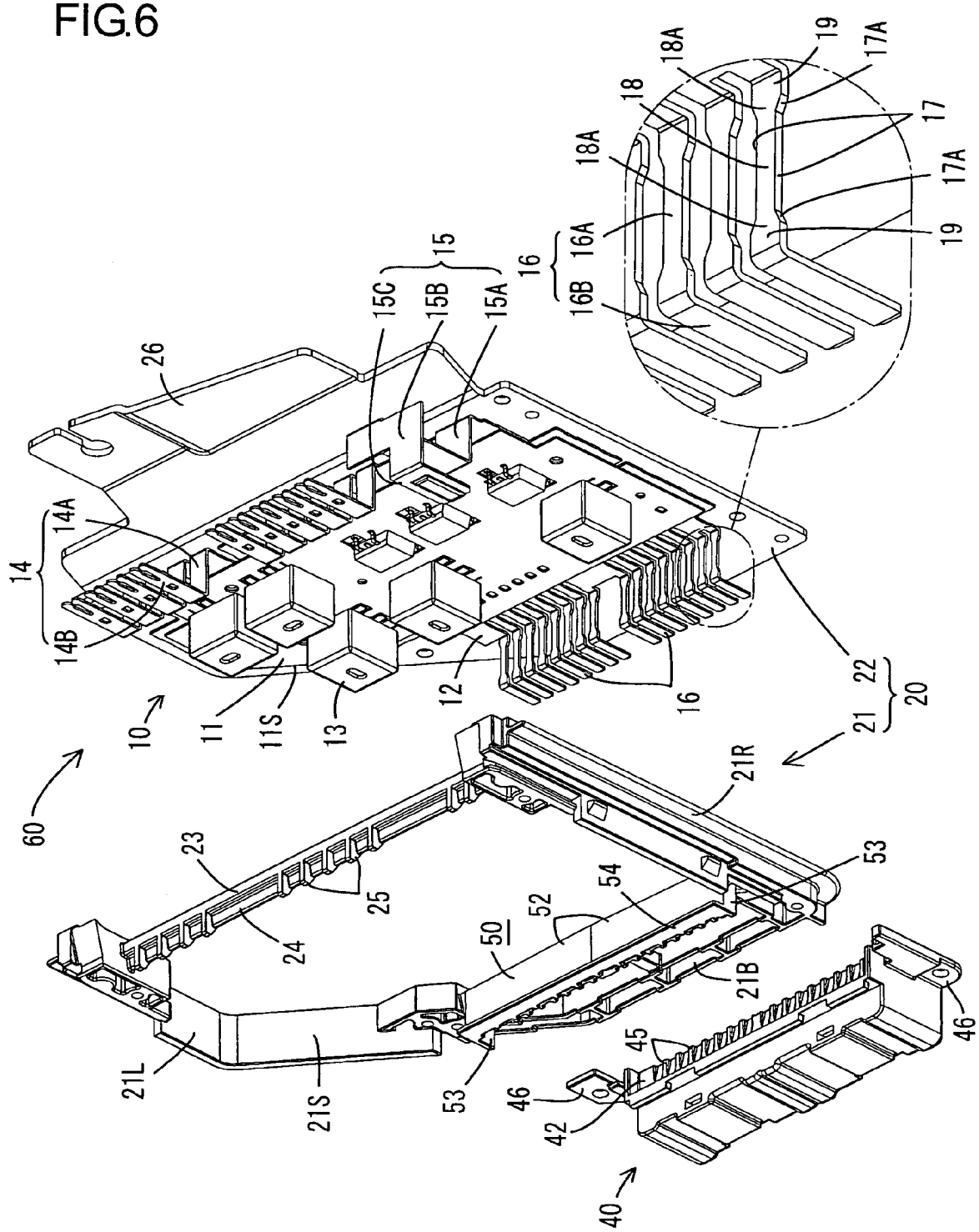
FIG. 6 is a perspective view showing a state before a frame body and a lower connector are assembled to a circuit structure in the electric connection box according to a second embodiment.

FIG. 6 is a perspective view showing the frame body 21 and the lower connector 40 before each are assembled to the circuit structure 10 in an electric connection box 60 according to the second embodiment. FIG. 7 is a side sectional view of the electric connection box 60 according to the second embodiment. FIG. 8 is a partially enlarged sectional view showing a state where the horizontal portions 16A of the lower bus bar terminals 16 are held between the first ribs 45 and the second ribs 58 in the electric connection box 60 according to the second embodiment.

The electric connection box 60 according to the second embodiment is different from the electric connection box 1 according to the first embodiment in that a narrow portion 18 is provided at the horizontal portion 16A of the lower bus bar terminal 16. Since the other constructions are the same as those of the first embodiment, the same reference numerals are given and duplicated description will be omitted.

Figure 7:
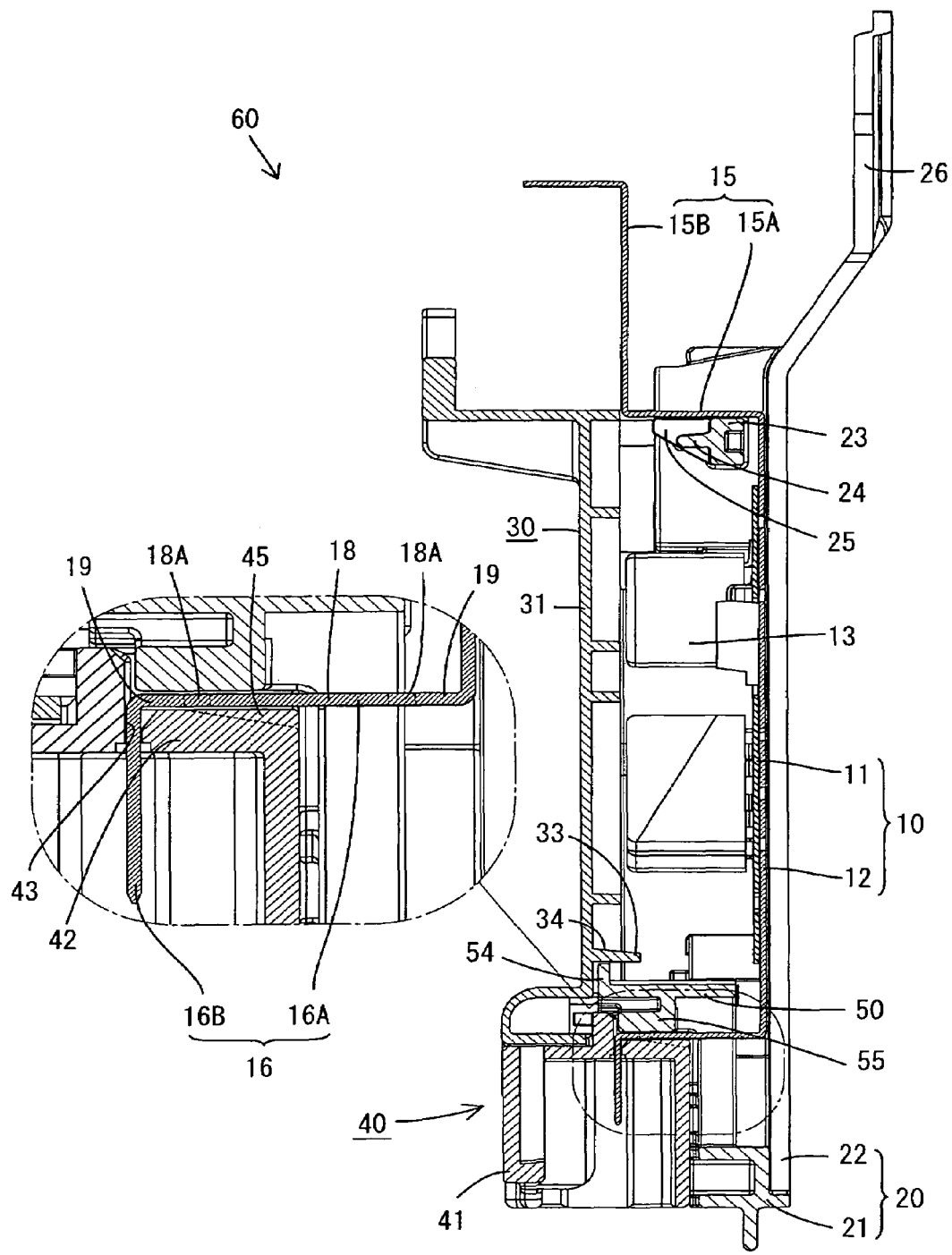
FIG. 7 is a side sectional view of the electric connection box according to the second embodiment.
Figure 8:
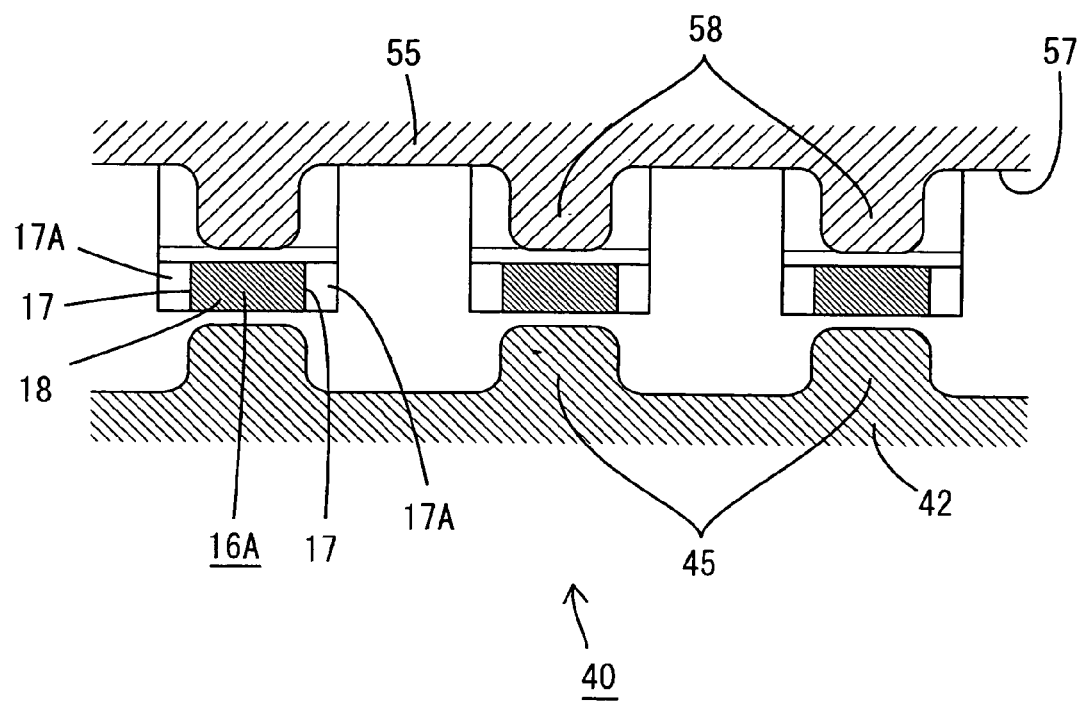
FIG. 8 is a partially enlarged sectional view showing a state where horizontal portions of lower bus bar terminals are held between first ribs and second ribs in the electric connection box according to the second embodiment.

As shown in FIGS. 6 to 8, a notch portion 17 is formed on both the right and left side edges of the horizontal portion 16A of the lower bus bar terminal 16. Thereby, the narrow portion 18 is formed on the horizontal portion 16A. In other words, the horizontal portion 16A includes a first width and a second width, the first width is larger than the second width.

The notch portion 17 is formed in an area between both ends 19 (between first and second ends 19), leaving the both ends 19 in the cabling direction (longitudinal direction) of the horizontal portion 16A. The both ends 19 of the horizontal portion 16A are left with the original width maintained.

Also, the both ends of the notch portion 17 include inclined portions 17A inclined inward (center side in the width direction) when faced to the center side. In the horizontal portion 16A, the portion where the inclined portion 17A is formed is a taper portion 18A whose width is gradually increased toward the both end sides in the cabling direction.

If water intrudes into the electric connection box 60 due to rain, car wash, etc., the water might reach the upper face 44 of the lower connector 40 and adhere to the periphery of the horizontal portion 16A of the lower bus bar terminal 16. In this case, the water drop adhering to the periphery of the horizontal portion 16A slides along the upper face of the lower connector 40 and flows to the adjacent other horizontal portions 16A.

However, in this embodiment, since the narrow portion 18 is provided at each of the horizontal portions 16A, a distance between the adjacent horizontal portions 16A is made larger. Thereby, the moisture adhering to the horizontal portion 16A that would otherwise reach the adjacent other horizontal portions 16A is stopped or significantly reduced, and a short circuit between the lower bus bar terminals 16 is avoided.

Moreover, with recent rapid increase of electrical equipment mounted to an automobile, an electric current amount flowing through the circuit structure 10 is increased, and accordingly, the lower bus bar terminals 16 needs to be designed so that it can withstand a large current amount to some extent. Therefore, in this embodiment, the width of the lower bus bar terminal 16 is not narrowed over the entire length but the narrow portion 18 is provided only at the horizontal portion 16A in contact with the ceiling portion 42 where a water drop is easily accumulated. Thereby, short circuit between the lower bus bar terminals 16 can be avoided while ensuring the current amount.

As mentioned above, according to this embodiment, the narrow portion 18 is provided at the horizontal portion 16A of the lower bus bar terminal 16. Thereby, the distance between the horizontal portions 16A of the adjacent lower bus bar terminals 16 is increased by the narrowed width. Therefore, the moisture adhering to the horizontal portion 16A that would otherwise reach the adjacent other horizontal portions 16A is stopped or significantly reduced, and a short circuit between the lower bus bar terminals 16 can be avoided. Also, since the narrow portion 18 is provided only at the horizontal portion 16A, the short circuit between the lower bus bar terminals 16 can be avoided while ensuring a current amount to be conducted to the lower bus bar terminal 16 to some-extent.

A third embodiment of the present invention will be described below referring to FIG. 9.

Figure 9:
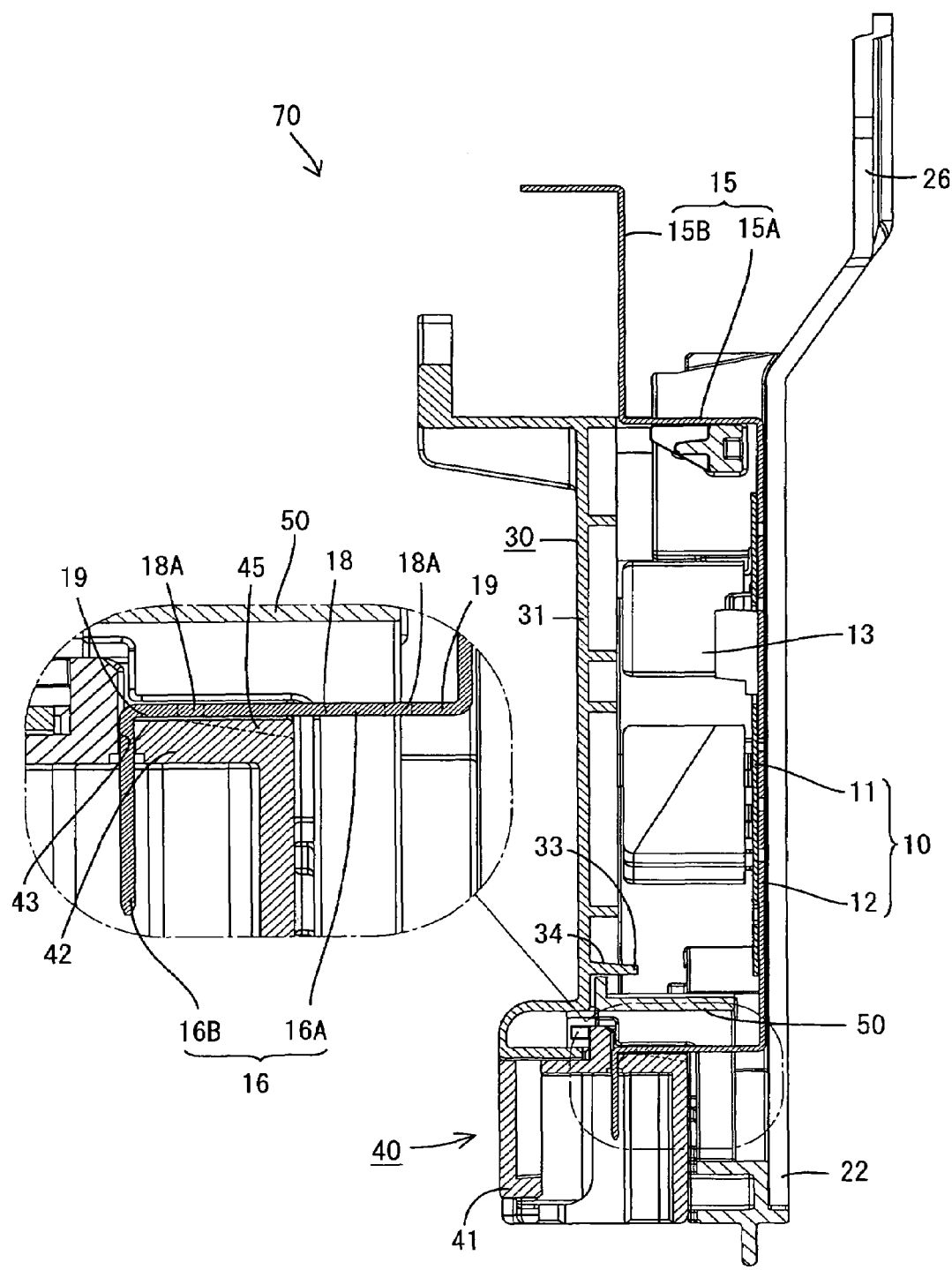
FIG. 9 is a side sectional view of the electric connection box according to a third embodiment.

FIG. 9 is a side sectional view of an electric connection box 70 according to the third embodiment.

The electric connection box 70 according to the third embodiment is different from the first or the second embodiment in that the displacement restriction portion 55 is not provided at the lower part of the water resistant wall 50. That is, in the third embodiment, the displacement restriction portion 55 for restricting upward displacement of the horizontal portion 16A by pressing the horizontal portion 16A of the lower bus bar terminal 16 from above is not provided. Note that the other aspects of this embodiment are similar to those of the first or the second embodiment, therefore the same reference numerals are given and duplicated description will be omitted.

When an external connector is to be fitted in the lower connector 40 of the electric connection box 70, an upward pressing force acts on the connection portion 16B by friction between the connection portion 16B of the lower bus bar terminal 16 and the terminal on the other party side. In this embodiment, different from the first embodiment, since the horizontal portion 16A is not pressed by the displacement restriction portion 55 from above, the upward pressing force applied to the connection portion 16B acts on an adhesion portion between the bus bar 12 and the radiator plate 22 through the horizontal portion 16A, and there is a fear that damage (such as separation) might occur at this adhesion portion. However, in this embodiment, since the narrow portion 18 is provided at the horizontal portion 16A, the horizontal portion 16A tends to be deflected elastically, and the upward pressing force acting on the connection portion 16B is absorbed by deformation and/or deflection of the horizontal portion 16A. Thereby, at a root portion of the horizontal portion 16A, the breakage such as separation on the adhesion portion between the bus bar 12 and the radiator plate 22 can be avoided. In this way, when the pressing force or frictional force on the lower bus bar terminal 16 acting with attachment/detachment of the external connector is large, it is more preferable to provide the narrow portion 18 at the horizontal portion 16A. Thereby, not only can a short circuit between the lower bus bar terminals 16 can be avoided, but the pressing force or frictional force acting on the lower bus bar terminal 16 can be absorbed.

In order to make the lower bus bar terminal 16 easy to be deflected, it might be possible to narrow the width of the lower bus bar terminal 16 over the entire length. Yet, this configuration might cause excessive deformation in the lower bus bar terminal 16 and could lead to breakage. However, in this embodiment, since the narrow portion 18 is provided only at the horizontal portion 16A, the lower bus bar terminal 16 can more easily be deflected while ensuring strength of the lower bus bar terminal 16 as a whole.

Also, since the both ends 19 of the horizontal portion 16A are portions where a particularly large force acts (at the fitting of the external connector), if the strength of this portion is not enough, it could follow that the lower bus bar terminal 16 breaks. However, in this embodiment, the both ends 19 of the horizontal portion 16A maintain the original width of the lower bus bar terminal 16, and sufficient strength is provided. Therefore, breakage of the lower bus bar terminal 16 can be avoided at the fitting of the external connector to the lower connector 40.

Moreover, the taper portion 18A whose width is gradually narrowed from the both ends 19 to the narrow portion 18 is provided between the both ends 19 and the narrow portion 18. Therefore, rigidity is gradually changed at the taper portion 18A. Excessive concentration of stress to the border between the both ends 19 and the narrow portion 18 at deflection and deformation of the horizontal portion 16A, which could result in breakage of the lower bus bar terminal 16 at this border, can be avoided.

The present invention is not limited to the embodiments described in the above description and drawings, but the following embodiments, for example, are also included in the technical scope of the present invention, and moreover, various changes other than the following may be made in a range not deviating from the scope of the invention.

(1) In the above embodiments, an example was shown that the first ribs 45 and the second ribs 58 are provided at positions brought into contact with the lower bus bar terminals 16 arranged side by side on the lower end edge of the bus bar 12, but the invention is not limited to this. For example, the first ribs and the second ribs may be provided at positions brought into contact with the upper bus bar terminals 14 arranged side by side on the upper end edge of the bus bar 12. The bus bar terminals may be arranged side by side on any portion of the bus bar only if they follow the cabling path crossing the case in the horizontal direction.

(2) In the above embodiments, an example was shown that the first ribs 45 are provided on the ceiling portion 42 of the lower connector 40 and the second ribs 58 are provided at the displacement restriction portion 55, but the invention is not limited to this. Members on which the first ribs and the second ribs are provided are not limited to the lower connector or the displacement restriction portion but may be any members only if they can be brought into contact with the horizontal portions of the bus bar terminals from below or from above.

(3) In the embodiments, an example was shown that the width of the first rib 45 in the right-and-left direction is smaller than the width of the horizontal portion 16A in the right-and-left direction, but the invention is not limited to this. It may only be that the first rib 45 has the width of the contact face 47 to be brought into contact with the horizontal portion 16A smaller than the width of each of the horizontal portions 16A in the right-and-left direction. For example, the first rib may be in a shape whose width in the right-and-left direction is gradually widened toward its lower end. In this case, the lower end of the first rib may be wider than the width of the horizontal portion 16A in the right-and-left direction.

(4) In the above embodiments, an example was shown that the narrow portion 18 is provided at the lower bus bar terminal 16 arranged side by side on the lower end edge of the bus bar 12, but the invention is not limited to this. For example, the narrow portion 18 may be provided at the upper bus bar terminal 14 arranged side by side on the upper end edge of the bus bar 12. In this case, too, short circuit between the adjacent bus bar terminals can be prevented by providing the narrow portion 18.

(5) In the above embodiments, an example was shown that the notch portion 17 is formed on both the right and left side edges of each of the horizontal portion 16A, but the invention is not limited to this. For example, even if the notch portion 17 is formed only on one of both the right and left side edges of the horizontal portion 16A, the narrow portion 18 narrower than the other areas can be formed.

(6) In the above embodiments, an example is shown that the lower bus bar terminal 16 is a bus bar 12 whose part is bent to the front side, but the invention is not limited to this. A metal piece, acting as a terminal, may be bonded to the bus bar by soldering, for example.

(7) In the above embodiments, an example is shown that the connection portion 16B of the lower bus bar terminal 16 extends downward from the extended end of the horizontal portion 16A substantially in parallel with the circuit board 11, but the invention is not limited to this. It may only be that the connection portion of the lower bus bar terminal extend in the direction crossing the horizontal portion. For example, the connection portion of the lower bus bar terminal may extend upward from the extended end of the horizontal portion in the diagonal direction to the circuit board.

What is claimed is:

1. An electric connection box comprising:
    a circuit structure having a face;
    a casing for accommodating the circuit structure therein;
    a plurality of bus bar terminals for electrically connecting the circuit structure and an external connector to each other, each bus bar terminal comprising a first portion extended in a first direction substantially perpendicular to the face of the circuit structure, the plurality of bus bar terminals being disposed parallel with each other along a second direction substantially perpendicular to the first direction; and
    a terminal support portion for supporting each first portion on a supporting side thereof, the supporting side extending along a plane including the first direction and the second direction, the terminal support portion comprising a plurality of first ribs corresponding to each first portion and at least one first groove portion, wherein:
    each first rib is projected to be in contact with the first portion, and
    the first groove portion is formed between two adjacent first ribs and is recessed toward the supporting side.

2. The electric connection box according to claim 1, wherein
    a width of a contact face of each first rib contacting the first portion is smaller than a width of a contact face of the first portion contacting the first rib.

3. The electric connection box according to claim 1, further comprising:
    an inclined portion extending along the first direction provided on a face of the first groove portion that is formed by recessing the first groove portion.

4. The electric connection box according to claim 1, further comprising:
    a displacement restriction portion for restricting displacement caused by inclination of the first portion due to pressing on the first portion, the displacement restriction portion comprising a plurality of second ribs corresponding to each first rib and at least one second groove portion, wherein
    each second rib is projected on a surface opposite to the first portion in the displacement restriction portion, and
    the second groove portion is formed between two adjacent second ribs and is recessed toward a side opposite to the supporting side of the terminal support portion.

5. The electric connection box according to claim 3, further comprising:
    a displacement restriction portion for restricting displacement caused by inclination of the first portion due to pressing on the first portion, the easing the displacement restriction portion comprising a plurality of second ribs corresponding to each first rib and at least one second groove portion, wherein
    each second rib is projected on a surface opposite to the first portion in the displacement restriction portion, and
    the second groove portion is formed between two adjacent second ribs and is recessed toward a side opposite to the supporting side of the terminal support portion.

6. The electric connection box according to claim 1, wherein
    each first portion includes a first part having a first width and a second part having a second width, the first width being larger than the second width.

7. The electric connection box according to claim 3, wherein
    each first portion includes a first part having a first width and a second part having a second width, the first widths being larger than the second width.

8. The electric connection box according to claim 4, wherein
    each first portion includes a first part having a first width and a second part having a second width, the first width being larger than the second width.

9. The electric connection box according to claim 5, wherein
    each first portion includes a first part having a first width and a second part having a second width, the first width being larger than the second width.

10. The electric connection box according to claim 6, wherein
    each bus bar terminal further comprises a second portion for connecting the external connector on an end which is different from an end connected with the circuit structure, the second portion extending in a third direction substantially perpendicular to the first direction and the second direction.

11. The electric connection box according to claim 7, wherein
    each bus bar terminal further comprises a second portion for connecting the external connector on an end which is different from an end connected with the circuit structure, the second portion extending in a third direction substantially perpendicular to the first direction and the second direction that disposed the bus terminals.

12. The electric connection box according to claim 8, wherein
    each bus bar terminal further comprises a second portion for connecting the external connector on an end which is different from an end connected with the circuit structure, the second portion extending in a third direction substantially perpendicular to the first direction and the second direction.

13. The electric connection box according to claim 9 wherein
    each bus bar terminal further comprises a second portion for connecting the external connector on an end which is different from an end connected with the circuit structure, the second portion extending in a third direction substantially perpendicular to the first direction and the second direction.

14. The electric connection box according to claim 6, wherein
    each first portion includes a first end and a second end formed on both ends thereof as the first part and a middle portion formed between the first end and the second end as the second part.

15. The electric connection box according to claim 7, wherein
    each first portion includes a first end and a second end formed on both ends thereof as the first part, and a middle portion formed between the first end and the second end as the second part.

16. The electric connection box according to claim 8, wherein
    each first portion includes a first end and a second end formed on both ends thereof as the first part, and a middle portion formed between the first end and the second end as the second part.

17. The electric connection box according to claim 9, wherein
    each first portion includes a first end and a second end formed on both ends thereof as the first part, and a middle portion formed between the first end and the second end as the second part.

18. The electric connection box according to claim 14, wherein each first portion includes at least one taper portion whose width narrows from the first part to the second part.

19. The electric connection box according to claim 15, wherein each first portion includes at least one taper portion whose width narrows from the first part to the second part.

20. The electric connection box according to claim 16, wherein each first portion includes at least one taper portion whose width narrows from the first part to the second part.

* * * * *

UNITED STATES PATENT AND TRADEMARK OFFICE
CERTIFICATE OF CORRECTION

PATENT NO. : 7,408,765 B2  
APPLICATION NO. : 11/472348  
DATED : August 5, 2008  
INVENTOR(S) : Tomoki Kanou Page 1 of 1

It is certified that error appears in the above-identified patent and that said Letters Patent is hereby corrected as shown below:

On the Title page, item (73) Assignee:

change: "Sumitomo Electric Indusries, Ltd., Osaka (JP)"  
    to: --Sumitomo Electric Industries, Ltd., Osaka (JP)--

Signed and Sealed this

Fourth Day of November, 2008

JON W. DUDAS  
*Director of the United States Patent and Trademark Office*